May 25, 1965 W. V. LANE ETAL 3,184,830

MULTILAYER PRINTED CIRCUIT BOARD FABRICATION TECHNIQUE

Filed Aug. 1, 1961

INVENTORS
WELDON V. LANE
EDMUND E. MALECKI
BY Harry M. Saragovitz
ATTORNEY.

3,184,830
Patented May 25, 1965

3,184,830

MULTILAYER PRINTED CIRCUIT BOARD FABRICATION TECHNIQUE

Weldon V. Lane, West Long Branch, and Edmund E. Malecki, Rumson, N.J., assignors to the United States of America as represented by the Secretary of the Army Filed Aug. 1, 1961, Ser. No. 128,596
6 Claims. (Cl. 29—155.5)
(Granted under Title 35, U.S. Code (1952), sec. 266)

The invention described herein may be manufactured and used by or for the Government for governmental purposes, without the payment of any royalty thereon.

This invention relates to printed circuits for electronic devices and particularly to such circuits wherein a plurality of different printed circuit boards are laminated together to constitute a unitary space saving circuit.

In the device of the invention the individual circuit boards are bonded together and insulated from one another but have output channels which extend to a common plane where a concentrated group of component parts may be connected to the circuits contained in the various strata of the assembled device.

Heretofore attempts to manufacture similar devices has proven impractical for reasons which will become apparent hereinafter. The individual layers of the structure are modified conventional printed circuit boards each bearing a different circuit. The various circuits may each contain a portion of the circuit for an integrated system or they may relate to separate devices or groups of components mounted on the common area.

To provide for interconnections from selected terminal areas on the various boards to the proper connecting pins on the component parts a system of clearance holes are formed in the circuit boards which are located to avoid conductors in the circuitry of adjacent circuit boards. The details of this structure will be set forth hereinafter.

The final step in fabricating structures of this kind is to mount the circuit components and solder all connections from the terminal areas of the circuits to the pins on the components. In prior devices this final step has been a difficult one because in laminating the boards the dielectric bonding material flows freely and covers the soldering surfaces of the circuit terminal areas. Consequently before soldering can be accomplished these areas must be cleaned. This is a hand operation which is time consuming and produces inferior results. When using this technique a large percentage of rejects appear due to circuit failures. This is particularly true, in miniaturized circuits.

The present invention overcomes difficulties heretofore encountered in fabricating such devices by providing a structure and technique which permits fast processing of the individual circuit boards and complete protection of terminal areas during the laminating operation. In practicing the invention immediately after placement of the circuit component parts upon the multilayer board all connections are perfectly soldered by application of heat to the component pins.

A primary object of the invention is to provide a printed circuit unit having greatly reduced overall dimensions while at the same time avoiding circuit breakdown due to closely spaced conductors.

A further object of the invention is to provide a multilayer printed circuit unit having consistently uniform high quality soldered connections.

A further object of the invention is to provide a technique for rapidly producing the completed units.

A still further object of the invention is to provide a printed circuit element in which the major proportions of the circuit conductors are rigidly sealed in place and protected from mechanical damage.

A further object of the invention is to provide a printed circuit unit which is universally adaptable to all electronic devices and systems and to other applications such as multiple terminal plug in connectors and the like.

Other objects and features of the invention will more fully appear from the following detailed description and will be particularly pointed out in the claims.

To provide a better understanding of the invention a particular embodiment thereof will be described and illustrated in the accompanying drawings wherein.

Figure 1:
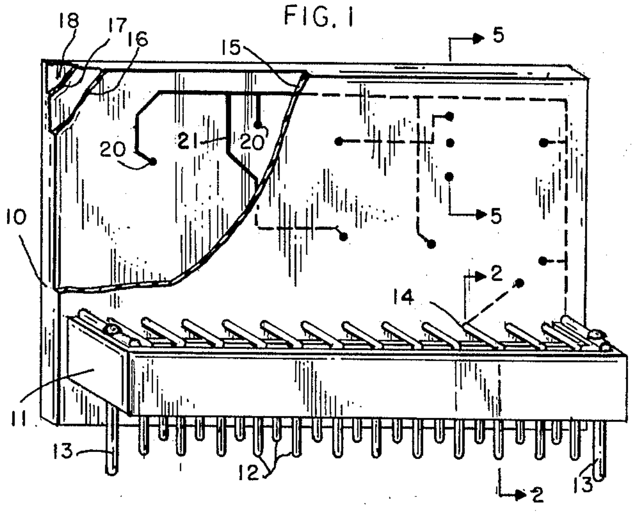
FIGURE 1 is a perspective view of a representative embodiment of the invention showing only a portion of its circuit elements.
Figure 2:
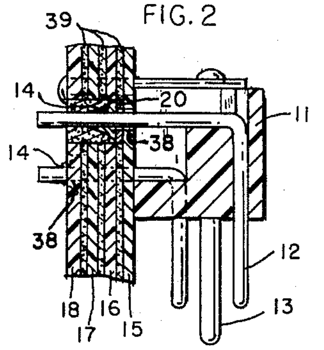
FIGURE 2 is a cross section on line 2—2 of FIGURE 1.
Figure 3:
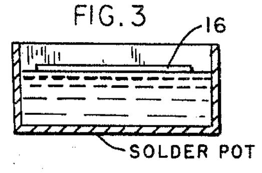
FIGURE 3 is a partially diagrammatic view illustrating a step in the fabrication of the invention.

The space saving aspect of the invention is extremely valuable because it accomplishes great reduction in the size of the circuit board with no sacrifice in the ability of the circuits to withstand over voltage or over load conditions. Actually in many ways the quality of the product is improved over conventional structures. As will appear in more detail hereinafter the laminated structure of the invention allows the conductors on one circuit board to cross over conductors on adjacent boards. This practice is not tolerable in conventional single plane printed circuit techniques.

As shown in the drawings the finished circuit is composed of a plurality of circuit boards which are bonded together with insulating cement. Each of the boards is prepared by any of the conventional printed circuit techniques wherein the circuit layout is photographically projected upon light sensitive acid resist applied to the copper clad insulation sheets commonly used. The image of the circuit is then developed to remove the resist in all areas except the circuit conductors and terminal areas. The surplus copper is then etched away to produce the metallic circuit. The board used in the invention differ in certain respects from conventional boards. They are each given an application of solder before the component parts are soldered into the circuit and also each of the terminal areas of the circuit and the solder thereon are drilled or punched to receive the component pins.

In the practice of the invention the circuit designer has wide latitude in placing his conductors and thus his component parts to best advantage and to shorten the conductors. This is possible by reason of the three dimensional character of the circuit design which permits cross overs of circuit conductors not possible in a single board printed circuit.

The invention is not only economically adaptable to a wide variety of uses but lends precision, complete reliability and rugged structure to electronic equipment. It is particularly useful in complex systems and in miniaturized modular systems.

By way of example a circuit board employing the invention and used in connection with a single module unit will be described. FIGURE 1 of the drawing shows a completed circuit board 10 to which is secured an insulating plug in connector unit 11 which is provided with a plurality of connector pins 12 and a pair of guide pins 13. The pins 12 are received in a circuit panel or other connecting means to complete circuits from the component parts on the module to power sources, to other modules and/or to load devices. Soldered connections are made from pins 12 to required terminal areas on the various superposed circuit boards as shown at 14.

The circuit board shown generally at 10 is composed of a plurality of separate boards laminated into a single unit. As shown there are three such boards 15, 16 and 17 and if desired a protective board 18 may be added. More or less boards may be used as required. The circuitry on each of the boards conforms to the requirements of the completed module.

For illustration only in FIGURE 1 the board 15 has been partially stripped from its terminal areas 20 and conductors 21.

In laying out the various circuits particular attention is given to the correct overlying or registering relationship between the circuits on the boards and this relationship must be maintained in the final laminated unit. To accomplish this end positioning holes 19 are formed in each board whose position bears the correct relationship to the respective circuits. The holes 19 are used to line up the individual boards during subsequent operations.

Prior to laminating the boards the copper terminal areas 20 are soldered to provide soldering preforms for the final soldering operation to be described hereinafter. Application of the solder may be done in any suitable manner. However dip soldering is recommended since it is fast, economical and may be performed by automatic machines.

In addition to the pin holes 22 in the circuit boards clearance holes 23 are provided. Clearance holes are not formed in the board 15 nearest the component mounting face 24. In the remaining circuit boards clearance holes are required to receive the solder preform at each terminal area on the circuit boards. Clearance holes are also required in the protective board 18 for each of the solder preforms.

Figure 5:
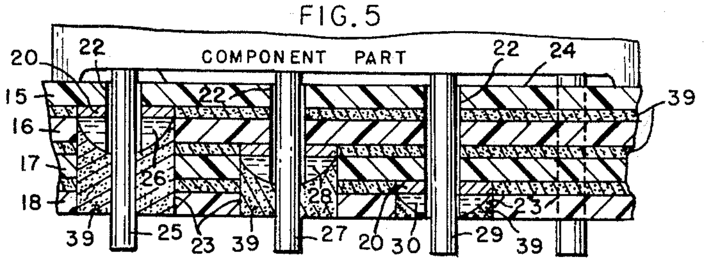

FIGURE 5 of the drawings shows a cross section of the assembled unit 10 wherein the pin 25 extends from its component part thru the hole 22 in the board 15, the copper terminal area 20 adhering to the board 15 and thence thru the solder 26. Since the boards 16, 17 and 18 lie below the board 15 clearance holes 23 must be formed therein to provide clearance for the solder preform 26.

Referring to pin 27 it is seen to extend to and thru another terminal area this time one adhering to the board 16. Clearance holes 23 are provided in boards 17 and 18 for the preform 28. The third pin 29 extends thru another terminal area this time on board 17 having a solder preform 30 thereon for which a clearance hole is provided in the protective board 18. A similar procedure is followed in connection with the circuit boards and the inner ends of the pins 12 to establish the connections 14. It will appear from the foregoing that connections from the component pins may be made to any terminal area upon any one of the circuit boards as determined by the original layout of the circuit of the module or other device with which the circuit is designed to function.

Figure 4:
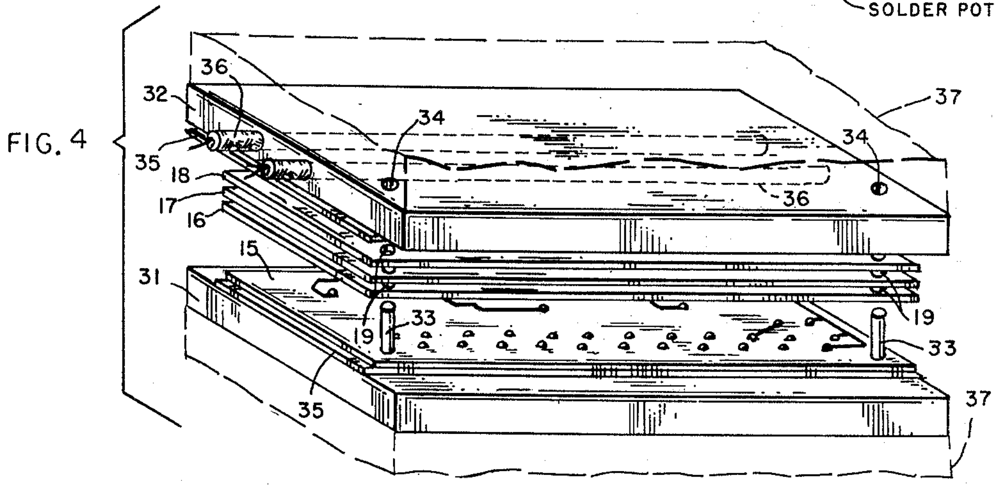
FIGURE 4 is a perspective view of a laminating fixture used in fabricating the invention.

The laminating operation is performed before the component parts are put in place and is executed with the aid of a positioning fixture shown in FIGURE 4. The fixture may have any suitable construction and may consist of a pair of platens 31 and 32 of metal such as aluminum between which the circuit boards are received.

The platen 31 is provided with guiding or positioning pins 33 secured perpendicularly in the platen while the upper platen 32 is provided with holes 34 into which the pins 33 extend. Before placing the boards in position a sheet of plastic such as Teflon, a trademark owned by E. I. du Pont de Nemours & Co. relating to tetrafluoroethylene polymer or other suitable material is placed upon the platen 31 to protect it from contamination by the laminating cement.

The circuit boards should be trimmed to substantially the same dimensions and are coated with a dielectric type cement preferably one which is curable by the application of heat. The cement is applied to the side of the boards opposite to that of the conductors or to both sides. The upper face of the board 15 is the component mounting face and is not coated with cement. Boards 15, 16, and 17 are then mounted on the pins 33 using holes 19. If the board 18 is to be used it is then mounted on the pins 33. A plastic protecting sheet 35 may now be placed on the superposed boards and the platen 32 placed in contact with the composite pile.

Heat and pressure are now applied in any suitable manner. The heat may be applied by means of electric heaters 36 embedded in one or both of the platens. Pressure is applied in any manner as by inserting the fixture in a conventional press having platens 37.

Heat and pressure are continued until the cement is cured after which the completed circuit board is removed from the fixture. The board thus constructed is rigid and extremely compact its total thickness may be less than 1/16 inch. Moreover most of the copper circuitry is thus hermetically and mechanically sealed against damage.

At each of the terminal lands or areas 20 on all of the individual boards the holes 22 are drilled or punched completely thru the boards. This operation also pierces the solder preforms at the respective terminals. As explained above each terminal has been placed to receive the pins of the various component parts. The components are now placed in their proper positions on the board with their pins projecting into their respective pin holes 22 as shown in FIGURE 5. Holes 38 are also drilled for the inner ends of the pins 12 on the connector 11.

Figure 6:
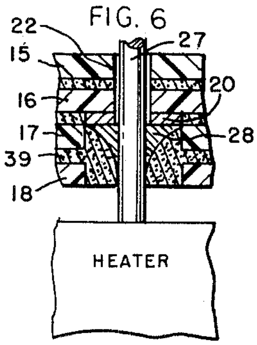
FIGURES 5 and 6 are enlarged partial cross sectional views of the laminated circuit board before and after completing the soldering of the pins of the component parts to their respective circuits and taken on line 5—5 FIGURE 1.

The final step to complete the unit is to apply heat to the ends of the component part pins. This may be done in any desired manner but preferably heat is applied to all the pins simultaneously for fast production. This heat melts the solder preforms and causes them to form a high quality electrical connection with the component pins. When the solder melts it flows along the pin and assumes the form of a filet as shown in FIGURE 6.

It is important to note that throughout the laminating operation there has been a flow of the cement 39 between the boards and into the clearance holes as shown in FIGURE 5. However the surfaces of the terminal areas 20 have been completely protected from the cement by the preforms. Thus the final soldering step creates a consistently good union between the component pins and the conductors on the various circuit boards.

In the laminating operation it has been observed that the presence of the free flowing cement appears to aid in forming well shaped and consistently uniform solder joints between component pins and the terminal areas 20.

It should be noted that in some instances connections may be required from one circuit board to another and not directly to a functional component. This may be accomplished by inserting a short wire extending thru registered terminals provided for the purpose and located on the circuit boards involved. Soldered connections will be completed when heat is applied to the extended end of the short wire in the same manner as the soldered connections are completed to the component pins.

What is claimed is:

1. A method of making composite laminated circuit units comprising preparing a plurality of individual printed circuit boards having metallic circuits thereon designed to make functional connection with at least a portion of an electronic system, the system including projecting and interconnecting conductors, said circuits having terminal areas for connection with the interconnecting conductors of the system, applying solder to said terminal areas, forming clearance chambers in said boards at said terminal areas to receive said solder then applying dielectric cement to at least one interengaging face of said circuit boards, superposing said boards and applying pressure thereto until said cement hardens, then forming interconnecting conductor receiving holes at said terminal areas extending through the boards, the terminal areas and the solder, inserting said conductors in the holes, and then heating the solder to soldering temperature.

2. A method of making a composite laminated circuit unit comprising preparing a plurality of individual printed circuit boards each having metallic circuits thereon to make functional connection with at least a portion of an electronic system, the said circuits having terminal connecting areas so arranged that interconnections from the superposed individual circuits to the system will have free access, soldering solder preforms on said terminal areas, forming clearance chambers in said boards at said terminal areas to receive said solder, applying dielectric cement to at least one interengaging face of the boards, registering the boards in superposed relation with their terminal areas in position to provide the said free access condition, applying pressure to the boards until the cement hardens, then forming interconnecting conductor receiving holes at each terminal area extending through the circuit boards, the terminal areas and the solder preforms, inserting the interconnecting conductors in said holes, and then heating the preforms to soldering temperature to thus complete connections from the terminal areas to the interconnecting conductors of the system, whereby the final solder connections to the pins of the system will be of high quality owing to the protection provided the terminal areas by applying the solder preforms thereto prior to the laminating step.

3. A method according to claim 1 wherein heat is applied simultaneously with the application of pressure in the laminating operation.

4. A method according to claim 2 wherein heat is applied simultaneously with the application of pressure in the laminating operation.

5. A method of making a composite laminated circuit unit comprising preparing a plurality of printed circuit boards having a metallic circuits adhering to dielectric sheets, said circuits having terminal areas for connection to an electronic system, applying solder to all of said terminal areas simultaneously by dip soldering, forming clearance chambers in said boards at said terminal areas to receive said solder, applying dielectric cement to at least one interengaging face of said circuit boards, superposing the boards and applying pressure and heat thereto until the cement hardens, forming connecting conductor receiving holes at said terminal areas extending through said circuit boards, the terminal areas and the solder, inserting connecting conductors from said system into and through said holes, and then heating said conductors and solder to soldering temperature.

6. A method of making a composite laminated circuit unit comprising preparing a plurality of printed circuit boards having metallic circuits adhering to dielectric sheets, said circuits having terminal areas for connection to an electronic system, applying solder to each terminal area simultaneously by dip soldering, forming board registering holes in said boards, forming clearance chambers in said boards at said terminal areas to receive said solder, applying dielectric cement to at least one interengaging face of said circuit boards, superposing the boards in predetermined relative position by aligning said board registering holes and applying heat and pressure until the cement hardens, connecting component conductor receiving holes at said terminal areas extending through said circuit boards, the terminal areas and the solder, inserting connecting conductors from said system into and through said holes, and then heating said interconnecting conductors and solder to soldering temperature.

References Cited by the Examiner

UNITED STATES PATENTS

| | | | |
|---|---|---|---|
| 2,502,291 | 3/50 | Taylor. | |
| 2,777,192 | 1/57 | Albright et al. | |
| 2,864,156 | 12/58 | Cardy. | |
| 2,907,925 | 10/59 | Parsons | 317—101 |
| 2,932,772 | 4/60 | Bowman et al. | |
| 3,007,997 | 11/61 | Panariti | 174—68.5 |

FOREIGN PATENTS

| | | |
|---|---|---|
| 738,575 | 10/55 | Great Britain. |

JOHN F. CAMPBELL, *Primary Examiner.*

JOHN P. WILDMAN, *Examiner.*